(12) United States Patent
Hsieh

(10) Patent No.: US 10,618,993 B2
(45) Date of Patent: Apr. 14, 2020

(54) PHOSPHORUS-CONTAINING OLEFIN POLYMER, METHOD FOR PREPARING THE SAME, AND COMPOSITION AND ARTICLE COMPRISING THE SAME

(71) Applicant: Elite Material Co., Ltd., Taoyuan (TW)

(72) Inventor: Chen-Yu Hsieh, Taoyuan (TW)

(73) Assignee: ELITE MATERIAL CO., LTD., Taoyuan (TW)

( * ) Notice: Subject to any disclaimer, the term of this patent is extended or adjusted under 35 U.S.C. 154(b) by 129 days.

(21) Appl. No.: 15/588,782

(22) Filed: May 8, 2017

(65) Prior Publication Data

US 2017/0342185 A1 Nov. 30, 2017

(30) Foreign Application Priority Data

May 27, 2016 (TW) .............................. 105116656 A

(51) Int. Cl.
| | | |
|---|---|---|
| *C08F 230/02* | (2006.01) | |
| *C08F 232/08* | (2006.01) | |
| *H05K 1/03* | (2006.01) | |
| *H05K 3/02* | (2006.01) | |

(52) U.S. Cl.
CPC .......... *C08F 230/02* (2013.01); *C08F 232/08* (2013.01); *H05K 1/034* (2013.01); *H05K 1/0326* (2013.01); *H05K 3/022* (2013.01); *H05K 2201/012* (2013.01); *H05K 2201/0158* (2013.01)

(58) Field of Classification Search
CPC ..................................................... C08F 230/02
See application file for complete search history.

(56) References Cited

U.S. PATENT DOCUMENTS

2013/0101862 A1* 4/2013 Wu ..................... B32B 15/14
428/457
2015/0166788 A1* 6/2015 Li ........................ C08L 71/00
524/508

FOREIGN PATENT DOCUMENTS

| CN | 103059308 A | 4/2013 |
| CN | 105056995 A | 11/2015 |

OTHER PUBLICATIONS

Office Action dated Aug. 24, 2016 in corresponding Taiwanese application (Search Report included), English translation provided, 6 pages total.
Office Action dated Feb. 3, 2017 in corresponding Taiwanese application(Search Report included), English translation provided, 5 pages total.

* cited by examiner

*Primary Examiner* — Arrie L Reuther
(74) *Attorney, Agent, or Firm* — Bacon & Thomas, PLLC

(57) ABSTRACT

The present invention provides a novel phosphorus-containing olefin polymer that comprises cycloolefin as a first component and a vinyl phosphorus-containing compound as a second component. The present invention further provides a method for producing such phosphorus-containing olefin polymer and a composition and an article comprising the same.

9 Claims, 2 Drawing Sheets

PHOSPHORUS-CONTAINING OLEFIN POLYMER, METHOD FOR PREPARING THE SAME, AND COMPOSITION AND ARTICLE COMPRISING THE SAME

FIELD OF THE INVENTION

The present invention relates to a phosphorus-containing olefin polymer that includes a composition comprising a phosphorus-containing olefin polymer, and to a prepreg, a resin film, a resin coated copper, a laminate and a printed circuit board prepared from the composition.

BACKGROUND OF THE INVENTION

In conventional techniques, a cycloolefin polymer is formed by the addition polymerization of cycloolefin monomers. Because the cycloolefin polymer has better transmittance, it is mainly used as a raw material of optical elements, such as lens or light-guiding plates. However, the cycloolefin polymer does not have a benzene ring in its structure. Hence, compared with the aromatic compounds, the cycloolefin polymer has very poor flame-resistance.

BRIEF SUMMARY OF THE INVENTION

The main aspect of the present invention is to provide a phosphorus-containing olefin polymer that is formed by the addition polymerization of monomer units and includes the following component units: a first component and a second component, wherein the monomer for the first component is dicyclopentadiene, norbornene or a combination thereof. The monomer for the second component is a vinyl phosphorus-containing compound, wherein the vinyl phosphorus-containing compound is selected from the group consisting of a vinyl DOPO-containing compound, vinyl DPPO-containing compound, a vinyl phosphazene compound, vinyl phosphate, an acrylate DOPO-containing compound and a combination thereof.

The 9,10-dihydro-9-oxa-10-phosphaphenanthrene-10-oxide (DOPO)-containing compound includes, but is not limited to, any one of the following structural formulae or a combination thereof:

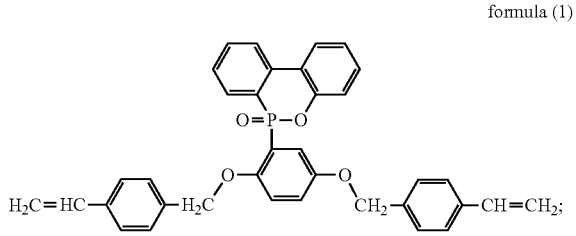

formula (1)

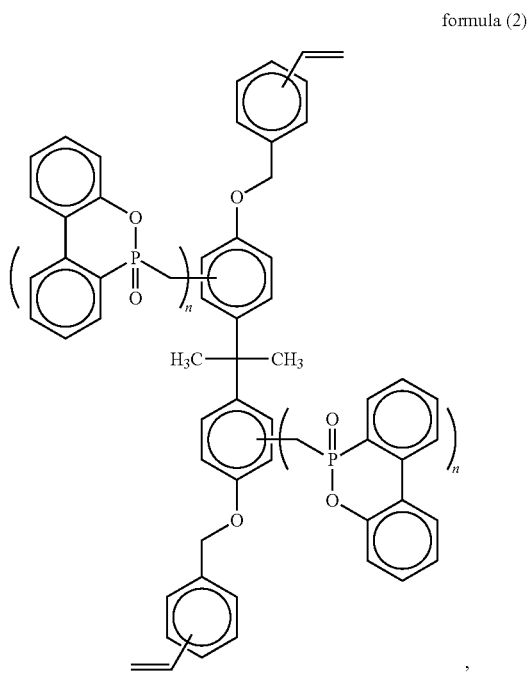

formula (2)

wherein n is an integer of from 1 to 4; and

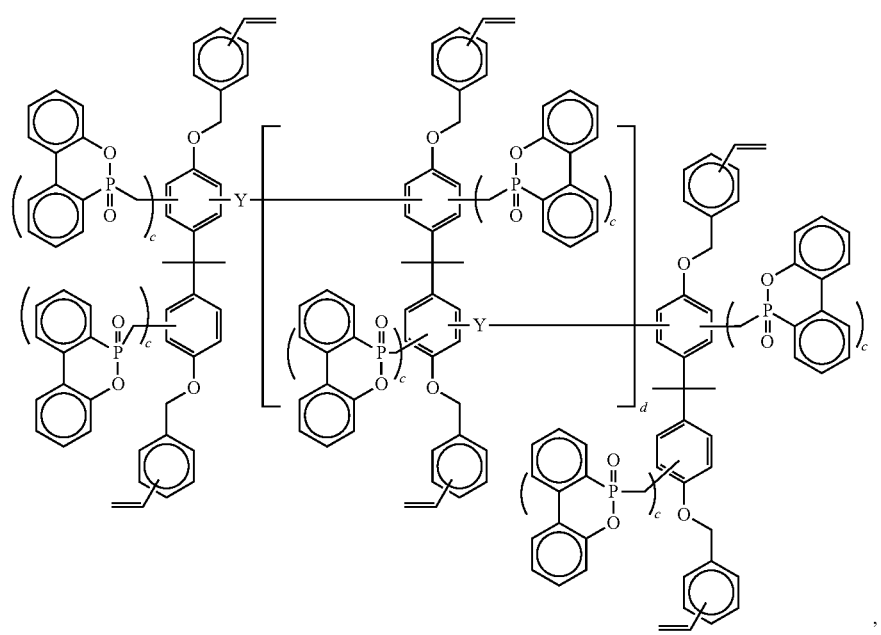

formula (3)

wherein Y is —CH$_2$— or —CH$_2$—O—CH$_2$—, n is a natural number of from 1 to 4, c is a natural number of from 1 to 4, and d is 0 or a natural number of from 1 to 6.

The diphenyl phosphine oxide (DPPO)-containing compound includes, but is not limited to, the following structural formula:

formula (4)

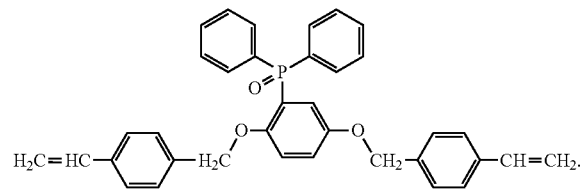

The vinyl phosphazene compound includes, but is not limited to, any one of the following structural formulae:

formula (5)

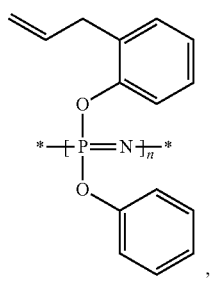

wherein n is an integer of from 1 to 6; and formula (6)

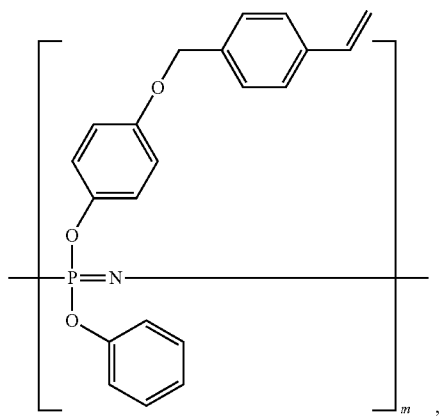

wherein m is an integer of from 1 to 6.

Preferably, the vinyl phosphazene compound can be an allyl phosphazene compound.

The vinyl phosphate compound includes, but is not limited to, any one of the following structural formulae:

formula (7)

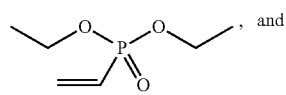, and formula (8)

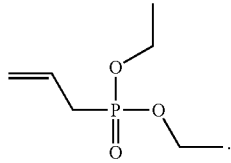

The acrylate DOPO-containing compound includes, but is not limited to, the following structural formula:

formula (9)

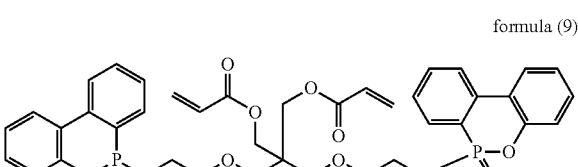

The dicyclopentadiene monomer has the following structural formula:

formula (10)

The norbornene monomer has the following structural formula:

formula (11)

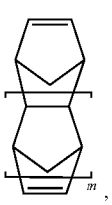

wherein m is a natural number of from 1 to 10.

The phosphorus-containing olefin polymer of the present application still preserves the vinyl function group after pre-polymerization. Such vinyl functional group can be further used in a cross-linking reaction.

In the phosphorus-containing olefin polymer of the present application, the contents of the first component and the second component are not limited. Preferably, the content ratio of the first component to the second component can be 99:1 to 1:99. Preferably, the content ratio of the first component to the second component can be any one of 90:10, 80:20, 70:30, 60:40, 55:45, 50:50, 45:55, 40:60, 30:70, 20:80, and 10:90. The content ratio of the first component to the second component is not limited to the above, for example, 75:25 is also included. In other words, the content ratio of the first component to the second component can be 75:25.

Preferably, the phosphorus-containing olefin polymer can further include a third component. That is, the phosphorus-containing olefin polymer of the present application can be formed by the addition polymerization of the first monomer, the second monomer and the third monomer.

The content of the third component is not limited and can be in any ratios in relative to the first component and the second component.

The monomer for the third component includes, but is not limited to, any one of the following structural formulas or a combination thereof: divinylbenzene, bis(vinylbenzene) ether, bis(4-vinylphenyl)methane, bis(4-vinylphenyl)ethane, styrene, ethylene, butadiene, and diethyl diallylmalonate.

Another aspect of the present invention is to provide a method for manufacturing a phosphorus-containing olefin polymer that comprises: polymerizing a first monomer and a second monomer in the presence of a catalyst to form a phosphorus-containing olefin polymer, wherein the first monomer is cycloolefin, and the second monomer is a vinyl phosphorus-containing compound.

The first monomer is selected from dicyclopentadiene, norbornene and a combination thereof. The second monomer is a vinyl phosphorus-containing compound and the vinyl phosphorus-containing compound is selected from a vinyl DOPO-containing compound, a vinyl DPPO-containing compound, a vinyl phosphazene compound, vinyl phosphate, an acrylate DOPO-containing compound and a combination thereof.

In the method for manufacturing the phosphorus-containing olefin polymer of the present invention, the catalyst is a ruthenium (Ru) catalyst.

Preferably, the ruthenium catalyst can be a Grubbs catalyst.

Preferably, the ruthenium catalyst is selected from the group consisting of the following Grubbs catalysts and a combination thereof:

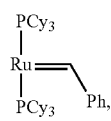

wherein Cy represents cyclohexyl and Ph represents phenyl;

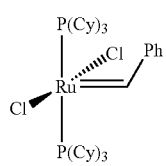

benzylidene-bis(tricyclohexylphosphine)-dichloro ruthenium, wherein Cy represents cyclohexyl and Ph represents phenyl;

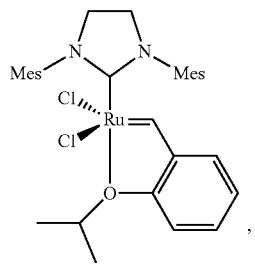

Mes represents 2,4,6-trimethyl phenyl, [1,3-bis-(2,4,6-trimethylphenyl)-2-imidazolidinylidene]dichloro (o-isopropoxyphenylmethylene)ruthenium

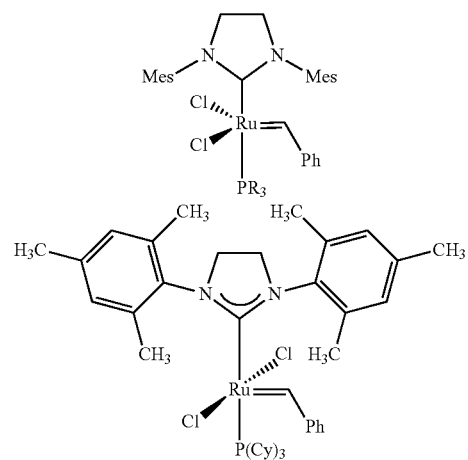

(1,3-bis(2,4,6-trimethylphenyl)-2-imidazolidinylidene)dichloro(o-phenylethylene)(tricyclohexylphosphine)ruthenium

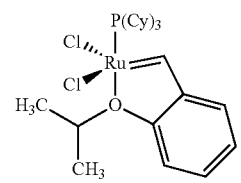

dichloro(o-isopropoxy phenyl methylene)(tricyclohexyl phosphine)ruthenium(II).

Preferably, the ruthenium catalyst can include, but not be limited to the following Grubbs catalysts: dichloro(o-isopropoxyphenylmethylene)(tricyclohexyl phosphine)ruthenium(II), and (1,3-bis-(2,4,6-trimethylphenyl)-2-imidazolidinylidene)dichloro(o-isopropoxyphenylmethylene) ruthenium.

The method for manufacturing a phosphorus-containing olefin polymer of the present invention can further include other catalysts, such as, but not be limited to: peroxide or a metallocene catalyst.

A further aspect of the present invention is to provide a resin composition that includes a phosphorus-containing olefin polymer, wherein the phosphorus-containing olefin polymer can be the above-mentioned phosphorus-containing olefin polymer.

Preferably, the resin composition further includes, but is not limited to, polyphenylene oxide, a linear olefin monomer or polymer, maleimide, cyanate ester, triallyl isocyanurate, polyester, acrylate, a curing accelerator, a flame retardant, an inorganic filler, a surfactant (silane), or a solvent.

The polyphenylene oxide can be vinyl polyphenylene oxide. Preferably, vinyl polyphenylene oxide can be bis-vinylbenzylbiphenylpolyphenylene oxide resin (Trade name: OPE-2st, available from MITSUBISHI GAS CHEMICAL COMPANY, INC.), or vinyl benzyl etherified modified bisphenol A polyphenylene oxide or (meth)acrylic polyphenylene oxide resin (Trade name: SA-9000, available from Sabic company), but is not limited to these.

The linear olefin polymer can be a styrene-butadiene-divinylbenzene terpolymer, a styrene-butadiene-maleic anhydride terpolymer, a vinyl-polybutadiene-urethane oligomer, a styrene-butadiene copolymer, a hydrogenated styrene-butadiene copolymer, a styrene-isoprene copolymer, a hydrogenated styrene-isoprene copolymer, a hydrogenated styrene-butadiene-divinylbenzene terpolymer, a polybutadiene homopolymer, a maleic anhydride modified styrene-butadiene copolymer, a methyl styrene copolymer, a petroleum resin, a cyclic olefin copolymer or a combination thereof.

Another aspect of the present invention is to provide an article manufactured from the above composition, wherein the article is a resin film, a prepreg, a laminate or a printed circuit board.

Specifically, the present invention provides a prepreg that has a reinforcing material and a layer disposed on the reinforcing material. The layer is formed by semi-curing a resin composition (semi-cured to B-staged). By using the above-mentioned resin composition, the prepreg of the present application has properties of a lower percent of thermal expansion, a lower dielectric constant, a lower dissipation factor, thermal resistance, flame retardant and free of halogen. The resin composition is attached to the reinforcing material through impregnation and is heated at a high temperature to become a semi-cured state, and thus form a prepreg.

A reinforcing material suitably used in the present invention includes a fiber material, a woven fabric and a non-woven fabric, such as fiber glass cloth, so as to increase the mechanical strength of the prepreg. Preferably, the reinforcing material can also optionally be pre-treated by a silane coupling agent.

The above prepreg can be cured to form a cured film or a solid insulating layer (C-staged) under heating at a high temperature or at a high temperature and a high pressure. If the resin composition contains a solvent, such solvent will be volatile and removed during the heating at a high temperature.

The present invention further provides a resin film, which is formed by baking the resin composition to become semi-cured. The resin composition can be optionally coated on a polyethylene terephthalate film (PET film) or a polyimide film, and then be baked to cure and form a resin film. As such, the laminate has properties of a lower percent of thermal expansion, a lower dielectric constant, a lower dissipation factor, thermal resistance, flame retardant and free of halogen.

The present invention further provides a resin coated copper (RCC), which is formed by coating resin varnish that is a low dielectric resin composition containing a phosphorus-containing flame retardant on copper foil or the resin varnish coated on PI side of a PI film with copper foil, and then heating the above at a high temperature to form a semi-cured resin coated copper. The above-obtained resin coated copper is also called flexible resin coated copper.

The present invention further provides a laminate that includes at least two metal layers and one insulating layer, wherein the insulating layer is disposed between the two metal layers and such insulating layer can be formed by sandwiching the above prepreg or resin film between the two metal layers and then curing at a high temperature and a high pressure. The material for the metal layers can be copper, aluminum, nickel, platinum, silver, golden or an alloy thereof, preferably copper foil. The laminate, such as copper clad laminate.

The present invention further provides a printed circuit board that is manufactured by the above laminate.

The phosphorus-containing olefin polymer of the present application is used in manufacturing a laminate that has the following advantages: (1) better (lower) percent of thermal expansion; (2) better T288 thermal resistance; (3) better solder dipping (S/D); (4) better (lower) dissipation factor measured at room temperature.

When the phosphorus-containing olefin polymer of the present application is used in manufacturing a laminate, it has the following unexpected effects: (1) better percent of thermal expansion, better T288 thermal resistance, better solder dipping thermal resistance, better flame retardant and better dissipation factor measured at room temperature achieved at the same time; (2) better dissipation factor measured at room temperature for the laminate subject to a PCT 5-hour moisture absorption test; (3) better dissipation factor measured at a high temperature of 120° C.

DETAILED DESCRIPTION OF THE INVENTION

Preparation Example 1

To a glass reaction bottle, 20 g toluene, 60 g ally phosphazene compound (SPV-100 available from Otsuka Chemical Co., Ltd.), 40 g dicyclopentadiene monomer (Dicyclopentadiene available from Sigma-Aldrich) and 0.01 g Grubbs catalyst II (Grubbs Catalyst 2nd Generation available from Sigma-Aldrich) were added to obtain a solution. The solution was heated to 80° C. and stirred for 12 hours. Then, the solution was cooled to room temperature to obtain a dark brown liquid solution, i.e., phosphorus-containing olefin polymer product A of the present invention (product A). The theoretical value of phosphorus atomic content of the phosphorus-containing olefin polymer is 7.2%.

Figure 1:
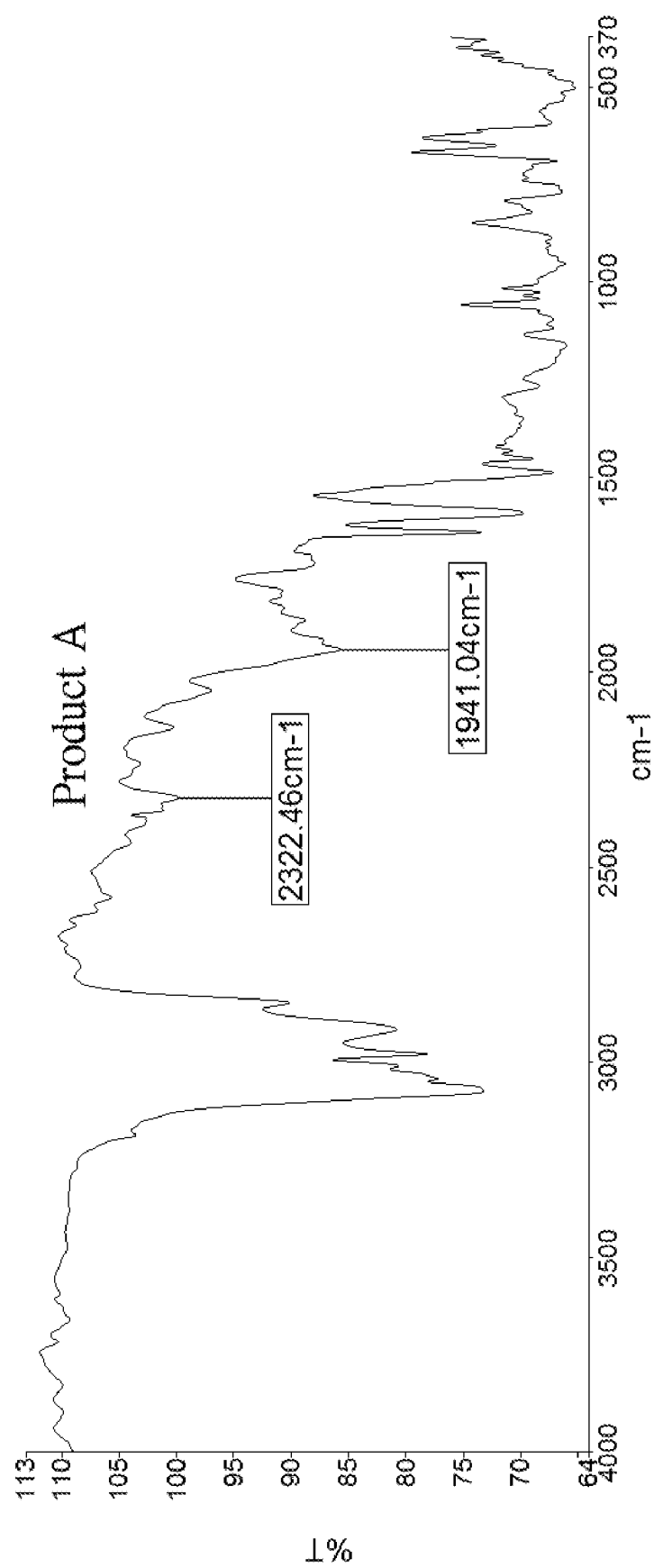
FIG. 1 is the FTIR spectrogram of the phosphorus-containing olefin polymer product A prepared in Preparation Example 1, wherein T % represents transmittance, and $cm^{-1}$ represents wave number.

Product A was analyzed in Fourier transform infrared spectroscopy (FTIR) and the results are shown in FIG. 1. The characteristic peaks of product A is 2322.46 $cm^{-1}$ and 1941.04 $cm^{-1}$.

Preparation Example 2

To a glass reaction bottle, 20 g toluene, 60 g allyl phosphazene compound (SPV-100 available from Otsuka Chemical Co., Ltd.), 40 g 5-viny -2-norbornene (5-vinyl-2- norbornene available from Sigma-Aldrich) monomer and 0.01 g Grubbs catalyst II (Grubbs Catalyst 2nd Generation available from Sigma-Aldrich) were added to obtain a solution. The solution was heated to 80° C. and stirred for 12 hours. Then, the solution was cooled to room temperature to obtain a dark brown liquid solution, i.e., phosphorus-containing olefin polymer product B of the present invention (product B).

Preparation Example 3

To a glass reaction bottle, 20 g toluene, 60 g DOPO-HQ terminal vinylated compound (i.e. vinylbenzyl-etherified-DOPO, synthesized by Elite Material Co., Ltd. and disclosed in U.S. Patent Application No.: U.S. Ser. No. 14/520,779, U.S. Patent Publication No.: 2015-0166788), 40 g dicyclopentadiene monomer (Dicyclopentadiene available from Sigma-Aldrich) and 0.01 g Grubbs catalyst II (Grubbs Catalyst 2nd Generation available from Sigma-Aldrich) were added to obtain a solution. The solution was heated to 80° C. and stirred for 12 hours. Then, the solution was cooled to room temperature to obtain a light brown liquid solution, i.e., phosphorus-containing olefin polymer product C of the present invention (product C).

Preparation Example 4

To a glass reaction bottle, 20 g toluene, 60 g DOPO-HQ terminal vinylated compound (synthesized by Elite Material Co., Ltd. and disclosed in U.S. Patent Application No.: U.S. Ser. No. 4/520,779, U.S. Patent Publication No.: 2015-0166788), 40 g 5-vinyl-2-norbornene (available from Sigma-Aldrich) monomer and 0.01 g Grubbs catalyst II (Grubbs Catalyst 2nd Generation available from Sigma-Aldrich) were added to obtain a solution. The solution was heated to 80° C. and stirred for 12 hours. Then, the solution was cooled to room temperature to obtain light brown liquid solution, i.e., phosphorus-containing olefin polymer product D of the present invention (product D).

Preparation Example 5

The phosphorus-containing olefin polymer of this example was prepared based on the method described in Preparation Example 1 except that in this example, cyclopentadiene monomer (Dicyclopentadiene available from Sigma-Aldrich) was replaced with commercial cycloolefin (Topas COC 5013 available from TOPAS Advanced Polymers Inc.) to obtain a dark brown liquid solution, i.e., phosphorus-containing olefin polymer product E of the present invention (product E).

Preparation Example 6

The phosphorus-containing olefin polymer of this example was prepared based on the method described in Preparation Example 1, except that in this example, 40 g allyl phosphazene compound (SPV-100 available from Otsuka Chemical Co., Ltd.) and 60 g dicyclopentadiene monomer (Dicyclopentadiene available from Sigma-Aldrich) were used to obtain a dark brown liquid solution, i.e., phosphorus-containing olefin polymer product F of the present invention (product F).

Preparation Example 7

To a glass reaction bottle, 20 g toluene, 40 g dicyclopentadiene monomer (Dicyclopentadiene available from Sigma-Aldrich) and 0.01 g Grubbscatalyst II (Grubbs Catalyst 2nd Generation available from Sigma-Aldrich) were added to obtain a solution. The solution was heated to 80° C. and stirred for 12 hours. Then, the solution was cooled to room temperature to obtain light brown liquid solution i.e., phosphorus-containing olefin polymer product G of the present invention (product G).

Preparation Example 8

The phosphorus-containing olefin polymer of this example was prepared based on the method described in Preparation Example 7, except that in this example, 40 g dicyclopentadiene monomer (Dicyclopentadiene) was replaced with 40 g 5-vinyl-2-norbornene (available from Sigma-Aldrich) monomer to obtain a light brown liquid solution, i.e., phosphorus-containing olefin polymer product H of the present invention (product H).

Preparation Example 9

The phosphorus-containing olefin polymer of this example was prepared based on the method described in Preparation Example 1, except that in this example, 60 g allyl phosphazene compound(SPV-100) was replaced with 60 g triallyl isocyanurate (TAIC available from Kingyorker Enterprise Co. Ltd.) to obtain a light brown liquid solution, i.e., phosphorus-containing olefin polymer product I of the present invention (product I).

Preparation Example 10

The phosphorus-containing olefin polymer of this example was prepared based on the method described in Preparation Example 1, except that in this example, 60 g allyl phosphazene compound (SPV-100) was not used. A light brown liquid solution was thus obtained to be polydicyclopentadiene.

Figure 2:
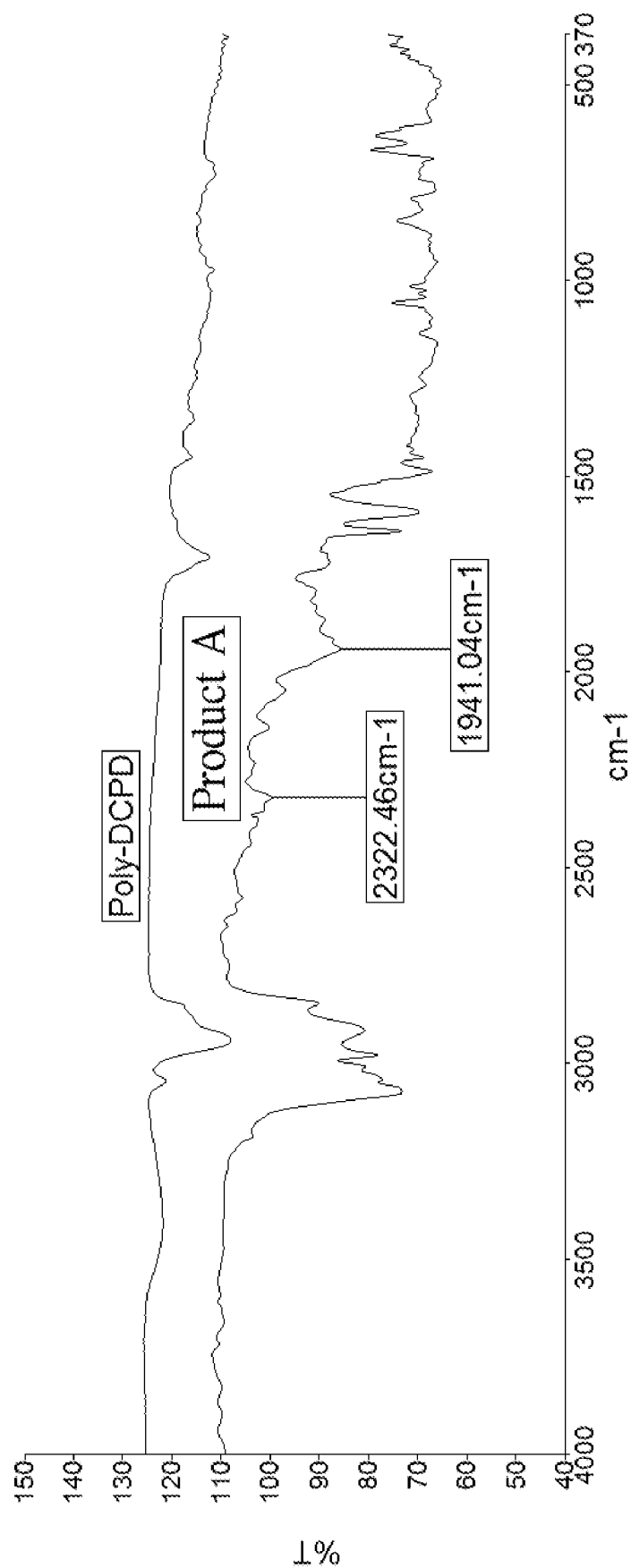
FIG. 2 is a FTIR spectrogram for comparing polydicyclopentadiene (Poly-DCPD) prepared in Preparation Example 10 with product A, wherein T % represents transmittance, and $cm^{-1}$ represents wave number.

Polydicyclopentadiene was analyzed by Fourier transform infrared spectroscopy (FTIR) and was compared with the spectrogram of product A. The results are shown in FIG. 2. The polydicyclopentadiene prepared in Preparation Example 10 does not have the two characteristic peaks of 2322.46 cm$^{-1}$ and 1941.04 cm$^{-1}$.

Example and Comparative Example

As shown in the following Table 1 to Table 6, the components and addition amounts of the resin compositions and the properties of laminates are listed.

Material Source

SFV-100: Allyl phosphazene flame retardant (i.e., formula (5), wherein n=3~6) available from Otsuka Chemical Co., Ltd.

DCPD monomer: Dicyclopentadiene monomer available from Sigma-Aldrich.

Grubbs catalyst II (Grubbs Catalyst 2nd Generation, (1,3-bis-(2,4,6-trimethylphenyl)-2-imidazolidinylidene)dichloro(o-isopropoxyphenylmethylene)ruthenium)): available from Sigma-Aldrich.

5-vinyl-2-norbornene monomer: available from Sigma-Aldrich.

DOPO-HQ terminal vinylated compound: synthesized by Elite Material Co., Ltd. (disclosed in U.S. patent application No.: U.S. Ser. No. 14/520,779, U.S. Patent Publication No.: 2015-0166788)

Topas COC 5013: Commercial cycloolefin polymer free of reaction functional groups and available from Topas Inc.
TAIC: Triallyl isocyanurate available from Kingyorker Enterprise Co., Ltd.
25B: Peroxide available from Nippon Oil & Fats Co., Ltd.
SC-2050 SVJ: Spherical silica available from Admatechs.
OPE-2st 2200: Vinyl polyphenylene oxide, available from MITSUBISHI GAS CHEMICAL COMPANY, INC.
BMI-80: Maleimide available from KI Chemical.
Ricon-257: styrene-butadiene-divinylbenzene terpolymer available from Cray Valley.
Toluene: available from Chambeco.
MEK: Methyl ethyl ketone available from Chambeco.

Method for Preparing Test Samples of Examples and Comparative Examples:

Each of the resin compositions in different groups of Examples and Comparative Examples was added to a stirring tank for stirring until complete dissolution and uniform mixing. The resin composition solution was placed in a impregnation tank, and then a fiber glass cloth (2116 E-fiber glass cloth) was impregnated in the above impregnation tank, such that the resin composition attached to and impregnated in fiber glass cloth. The fiber glass cloth was baked at a temperature of from 120 to 170° C. to become semi-cured (B-Staged), and thus a prepreg was obtained.

1. Copper Clad Laminate (Four-ply):

Two HTE (High Temperature Elongation) copper foils (0.5 ounces for each) (a thickness of 18 micrometers) and four prepregs made from each of the test samples were provided. In each prepreg, the resin content was about 55%. One copper foil, four prepregs and one copper foil were stacked sequentially, and then were laminated in a vacuum condition at 195° C. for 2 hours to form a copper clad laminate for each group, wherein the four laminated prepregs were cured to form an insulating layer between two copper foils and the resin content in the insulating layer was about 55%.

2. Copper-free Laminate (Four-ply):

The above copper clad laminates (four-ply) were etched to remove the copper foils on two sides, so as to obtain a copper-free laminate (four-ply). The copper-free laminate (four-ply) was formed by laminating four prepregs (C-staged), and the resin content of the copper-free laminate (four-ply) was about 55%.

3. Copper-free Laminate (Two-ply):

Two HTE (High Temperature Elongation) copper foils (0.5 ounces for each) (a thickness of 18 micrometers) and two prepregs made from each of the test samples were provided. In each prepreg, the resin content was about 55%. One copper foil, two prepregs and one copper foil were stacked sequentially, and then were laminated in a vacuum condition at 195° C. for 2 hours to form a copper clad laminate for each group, wherein the two laminated prepregs were cured to form an insulating layer between two copper foils and the resin content in the insulating layer was about 55%.

Subsequently, the above copper clad laminate (two-ply) was etched to remove the copper foils on two sides, so as to obtain a copper-free laminate (two-ply). The copper-free laminate (two-ply) was formed by laminating two prepregs (C-staged). The resin content of the copper-free laminate (two-ply) was about 55%.

Laminate Property Analysis Item and a Test Method Thereof:

1. Determination of Laminate Appearance

The surface of the copper-free laminate (four-ply) was visually determined to be flat and smooth or weave exposed. The size of the copper-free laminate is 9×12 inch$^2$. If the surface of the copper-free laminate has at least one more than 1×1 cm$^2$ weave exposure, such laminate is determined as a dry plate. If the surface of the laminate is flat and smooth, no dry plate occurs. Weave exposure is determined based on the common knowledge of a person skilled in the art. If a dry plate phenomenon occurs on a laminate, such laminate cannot be used in the subsequent multilayer sheets or circuit boards.

2. Glass Transition Temperature

In a glass transition temperature test, the above copper-free laminate (four-ply) was used as a sample. The glass transition temperature of the sample was measure by using Dynamic Mechanical Analyzer (DMA) and referring to the method described in IPC-TM-650 2.4.24.4 Glass Transition and Modulus of Materials Used in High Density Interconnection (HDI) and Microvias-DMA Method.

3. Percent of Thermal Expansion

In the measurement of the percent of thermal expansion, a copper-free laminate (four-ply) was used as a sample. The measurement was performed by using a thermal mechanical analyzer (TMA), heating in a heating rate of 10° C./min from 50° C. to 260° C. and referring to the method described in IPC-TM-650 2.4.24.5 to determine the dimensional change of each sample (unit: %). The lower a percent of thermal expansion is, the better the laminate is.

4. T288 Thermal Resistance

In a T288 thermal resistance test, the above copper clad laminate with 6.5 mm×6.5 mm was used as a sample. At a constant temperature of 288° C., a thermal mechanical analyzer (TMA) was used and based on the method described in IPC-TM-650 2.4.24.1, the time that no delamination occurred after the copper clad laminate was heated was measured. A longer time means that the thermal resistance of the copper clad laminate made from the resin composition is better.

5. Solder Dipping (S/D)

In a solder dipping test, the above copper clad laminate (four-ply) was used as a sample. The method described in IPC-TM-650 2.4.23 Soldering Resistance of Laminate Materials to measure each sample was referred to. Each sample was dipped in a solder pot with a constant temperature of 288° C. for 10 seconds, and then was taken out at room temperature for 10 seconds. The above steps were repeated and the repeat number was recorded until the laminate was delaminated. In general, the more the repeat number for each sample in solder dipping without delamination is, the better the thermal resistance of an article (such as copper clad laminate) made from the resin composition is.

6. Dielectric Constant and Dissipation Factor:

In the measurements of a dielectric constant and a dissipation factor, the above copper-free laminate (two-ply) was used as a sample. A microwave dielectrometer (available from Japan AET Company) was used and based on the method described in. TIS C2565, each sample was measured at room temperature (about 25° C.) and a frequency of 10 GHz. The lower a dielectric constant and a dissipation factor are, the better the dielectric properties of a sample are. The Dk value difference smaller than or equivalent to 0.05 means that laminates do not have a significant difference in dielectric constant while the Dk value difference greater than 0.05 means that different laminates have a significant difference in dielectric constant. The Df value difference smaller than or equivalent to 0.0005 means that laminates do not have a significant difference in dissipation factor while the Df value difference greater than 0.0005 means that different laminates has a significant difference in dissipation factor.

7. Dissipation Factor Post-moisture Absorption

In the measure of a dissipation factor post-moisture absorption, the above copper-free laminate (two-ply) was used as a sample. The sample was placed in 121° C. saturated water vapor (pressure cooking test, PCT test) for 5-hour moisture absorption, and then a dissipation factor test was performed. The method for testing the dissipation factor is the same as that in the above item 6.

8. High Temperature Dissipation Factor

In a high temperature dissipation factor test, the above copper-free laminate (two-ply) was used as a sample. The test method is the same as that in the above item 6, except that the measurement at room temperature (about 25° C.) was conducted at 120° C.

9. Flame Retardant Test

In a flame retardant test, a copper-free laminate (four-ply) with 125 mm×13 mm was used as a sample. Based on the method of UL94, measurement was performed and the results of flame retardant analyses can be expressed as V-0, V-1, and V-2, wherein the flame retardant of V-0 is better than the flame retardant of V-1 and the flame retardant of V-1 is better than the flame retardant of V-2. If a sample is burned up, the flame retardant is the worst.

TABLE 1

| Resin composition | Component | Name of raw material | E1 | E2 | E3 | E4 | E5 | C1 | C2 | C3 | C4 |
|---|---|---|---|---|---|---|---|---|---|---|---|
| Polymer | Product A prepared in Preparation Example 1 | Product A | 100 | | | | | | | | |
| | Product B prepared in Preparation Example 2 | Product B | | 100 | | | | | | | |
| | Product C prepared in Preparation Example 3 | Product C | | | 100 | | | | | | |
| | Product D prepared in Preparation Example 4 | Product D | | | | 100 | | | | | |
| | Product E prepared in Preparation Example 5 | Product E | | | | | | 100 | | | |
| | Product F prepared in Preparation Example 6 | Product F | | | | | 100 | | | | |
| | Product G prepared in Preparation Example 7 | Product G | | | | | | | | 100 | 40 | 40 |
| | Product H prepared in Preparation Example 8 | Product H | | | | | | | | | |
| | Product I prepared in Preparation Example 9 | Product I | | | | | | | | | |
| Monomer | DCPD monomer | | | | | | | | | | |
| | 5-vinyl-2-norbornene monomer | | | | | | | | | | |
| | cycloolefin polymer | Topas COC 5013 | | | | | | | | | |
| | TAIC | | | | | | | | | | |
| Flame retardant | allyl phosphazene | SPV-100 | | | | | 20 | | | 60 | |
| | DOPO-HQ terminal vinylated compound | | | | | | | | | | 60 |
| Catalyst | ruthenium catalyst | Grubbs 2nd | | | | | | | | 0.01 | 0.01 |
| | peroxide | 25B | 1 | 1 | 1 | 1 | 1 | 1 | 1 | 1 | 1 |
| Inorganic filler | spherical silica | SC-2050 SVJ | 30 | 30 | 30 | 30 | 30 | 30 | 30 | 30 | 30 |
| Solvent | toluene | | 100 | 100 | 100 | 100 | 100 | 100 | 100 | 100 | 100 |

TABLE 2

| Property of laminate | Test Item (Method) | Unit | E1 | E2 | E3 | E4 | E5 | C1 | C2 | C3 | C4 |
|---|---|---|---|---|---|---|---|---|---|---|---|
| appearance | dry plate (visually determined) | no unit | No | No | No | No | No | YES | No | No | No |
| Glass transition temperature | Tg (DMA) | ° C. | 140 | 153 | 147 | 177 | 151 | 107 | 170 | 115 | 112 |
| Percent of thermal expansion | Dimensional change (TMA) | % | 3.09 | 3.01 | 2.99 | 2.94 | 3.03 | 3.43 | 3.42 | 3.54 | 3.34 |
| T288 thermal resistance | T288 (TMA) | minute | 61 | 62 | 60 | 62 | 60 | 10 | 15 | 10 | 10 |
| Solder dipping | S/D | cycle | >20 | >20 | >20 | >20 | >20 | 5 | >20 | 15 | 15 |
| Dielectric constant | Dk@10 GHz @25° C. | no unit | 3.58 | 3.52 | 3.65 | 3.61 | 3.57 | 3.65 | 3.45 | 3.56 | 3.86 |
| Dissipation factor | Df@10 GHz @25° C. | no unit | 0.0053 | 0.0048 | 0.0056 | 0.0053 | 0.0055 | 0.0064 | 0.0045 | 0.0048 | 0.0068 |
| Dissipation factor post-moisture absorption | Df@10 GHz @25° C. after 5-hour PCT | no unit | 0.0055 | 0.0051 | 0.0059 | 0.0055 | 0.0057 | 0.0070 | 0.0048 | 0.0051 | 0.0071 |
| High temperature dissipation factor | Df@10 GHz & @120° C. | no unit | 0.0054 | 0.0050 | 0.0058 | 0.0054 | 0.0056 | 0.0067 | 0.0048 | 0.0052 | 0.0072 |
| Flame retardance test | UL94 | no unit | V-0 | V-0 | V-0 | V-0 | V-0 | V-0 | Burned out | V-0 | V-0 |

TABLE 3

| Resin composition | Component | Name of raw material | C5 | C6 | C7 | C8 | C9 | C10 | C11 | C12 | C13 |
|---|---|---|---|---|---|---|---|---|---|---|---|
| Polymer | Product A prepared in Preparation Example 1 | Product A | | | | | | | | | |
| | Product B prepared in Preparation Example 2 | Product B | | | | | | | | | |
| | Product C prepared in Preparation Example 3 | Product C | | | | | | | | | |
| | Product D prepared in Preparation Example 4 | Product D | | | | | | | | | |
| | Product E prepared in Preparation Example 5 | Product E | | | | | | | | | |
| | Product F prepared in Preparation Example 6 | Product F | | | | | | | | | |
| | Product G prepared in Preparation Example 7 | Product G | | | | | | | | | |
| | Product H prepared in Preparation Example 8 | Product H | 100 | 40 | 40 | | | | | | |
| | Product I prepared in Preparation Example 9 | Product I | | | | | 100 | 40 | 40 | | |
| Monomer | DCPD monomer | | | | | | | | | 40 | |
| | 5-vinyl-2-norbornene monomer | | | | | | | | | | 40 |
| | cycloolefin polymer | Topas COC 5013 | | | | | | | | | 40 |
| | TAIC | | | | | | | | | | |
| Flame retardant | allyl phosphazene | SPV-100 | | 60 | | | 60 | | 60 | 60 | 60 |
| | DOPO-HQ terminal vinylated compound | | | | 60 | | | 60 | | | |
| Catalyst | ruthenium catalyst | Grubbs 2nd | 0.01 | 0.01 | 0.01 | 0.01 | 0.01 | 0.01 | 0.01 | 0.01 | 0.01 |
| | peroxide | 25B | 1 | 1 | 1 | 1 | 1 | 1 | 1 | 1 | 1 |
| Inorganic filler | spherical silica | SC-2050 SVJ | 30 | 30 | 30 | 30 | 30 | 30 | 30 | 30 | 30 |
| Solvent | toluene | | 100 | 100 | 100 | 100 | 100 | 100 | 100 | 100 | 100 |

TABLE 4

| Property of laminate | Test Item (Method) | Unit | C5 | C6 | C7 | C8 | C9 | C10 | C11 | C12 | C13 |
|---|---|---|---|---|---|---|---|---|---|---|---|
| appearance | dry plate (visually determined) | no unit | No | No | No | No | No | No | No | No | Yes |
| Glass transition temperature | Tg (DMA) | °C. | 142 | 135 | 131 | 161 | 134 | 132 | 101 | 124 | 131 |
| Percent of thermal expansion | Dimensional change (TMA) | % | 3.24 | 3.56 | 3.56 | 3.46 | 3.76 | 3.67 | 3.76 | 3.76 | 3.56 |
| T288 thermal resistance | T288 (TMA) | minute | 10 | 15 | 15 | 15 | 15 | 13 | 6 | 16 | 10 |
| Solder dipping | S/D | cycle | 15 | 17 | 18 | 18 | 13 | 19 | 12 | 14 | 11 |
| Dielectric constant | Dk@10 GHz @25° C. | no unit | 3.86 | 3.58 | 3.78 | 3.71 | 3.88 | 3.63 | 3.78 | 3.68 | 3.68 |
| Dissipation factor | Df@10 GHz @25° C. | no unit | 0.0058 | 0.0058 | 0.0059 | 0.0061 | 0.0068 | 0.0061 | 0.0068 | 0.0065 | 0.0063 |
| Dissipation factor post-moisture absorption | Df@10 GHz @25° C. after 5-hour PCT | no unit | 0.0061 | 0.0062 | 0.0064 | 0.0066 | 0.0075 | 0.0067 | 0.0071 | 0.0069 | 0.0068 |
| High temperature dissipation factor | Df@10 GHz & @120° C. | no unit | 0.0062 | 0.0061 | 0.0062 | 0.0065 | 0.0077 | 0.0069 | 0.0073 | 0.0071 | 0.0067 |
| Flame retardance test | UL94 | no unit | Burned out | V-0 | V-0 | Burned out | V-0 | V-0 | V-0 | V-0 | V-0 |

TABLE 5

| Resin composition | Component | Name of raw material | E6 | E7 | E8 | E9 | E10 | C14 | C15 | C16 | C17 |
|---|---|---|---|---|---|---|---|---|---|---|---|
| Polymer | Product A prepared in Preparation Example 1 | Product A | 40 | | | | | | | | |
| | Product B prepared in Preparation Example 2 | Product B | | 40 | | | | | | | |
| | Product C prepared in Preparation Example 3 | Product C | | | 40 | | | | | | |

TABLE 5-continued

| Resin composition | Component | Name of raw material | E6 | E7 | E8 | E9 | E10 | C14 | C15 | C16 | C17 |
|---|---|---|---|---|---|---|---|---|---|---|---|
| | Product D prepared in Preparation Example 4 | Product D | | | | 40 | | | | | |
| | Product E prepared in Preparation Example 5 | Product E | | | | | | | 40 | | |
| | Product F prepared in Preparation Example 6 | Product F | | | | | 40 | | | | |
| | Product G prepared in Preparation Example 7 | Product G | | | | | | | | 40 | |
| | Product H prepared in Preparation Example 8 | Product H | | | | | | | | | 40 |
| | Product I prepared in Preparation Example 9 | Product I | | | | | | | | | 40 |
| Monomer | DCPD monomer | | | | | | | | | | |
| | 5-vinyl-2-norbornene monomer | | | | | | | | | | |
| | cycloolefin polymer | Topas COC 5013 | | | | | | | | | |
| | TAIC | | | | | | | | | | |
| Polyphenylene oxide | vinyl polyphenylene oxide | OPE-2st 2200 | 60 | 60 | 60 | 60 | 60 | 60 | 60 | 60 | 60 |
| Linear olefin | styrene-butadiene-divinylbenzene terpolymer | Ricon-257 | 15 | 15 | 15 | 15 | 15 | 15 | 15 | 15 | 15 |
| Maleimide | maleimide | BMI-80 | 10 | 10 | 10 | 10 | 10 | 10 | 10 | 10 | 10 |
| Flame retardant | allyl phosphazene | SPV-100 | | | | | 20 | | 60 | 60 | 60 |
| | DOPO-HQ terminal vinylated compound | | | | | | | | | | |
| Catalyst | ruthenium catalyst | Grubbs 2nd | | | | | | | | | |
| | peroxide | 25B | 1 | 1 | 1 | 1 | 1 | 1 | 1 | 1 | 1 |
| Inorganic filler | spherical silica | SC-2050 SVJ | 30 | 30 | 30 | 30 | 30 | 30 | 30 | 30 | 30 |
| Solvent | toluene | | 100 | 100 | 100 | 100 | 100 | 100 | 100 | 100 | 100 |
| | MEK | | 30 | 30 | 30 | 30 | 30 | 30 | 30 | 30 | 30 |

TABLE 6

| Property of laminate | Test Item (Method) | Unit | E6 | E7 | E8 | E9 | E10 | C14 | C15 | C16 | C17 |
|---|---|---|---|---|---|---|---|---|---|---|---|
| appearance | dry plate (visually determined) | no unit | No | No | No | No | No | No | No | No | No |
| Glass transition temperature | Tg (DMA) | °C. | 189 | 192 | 195 | 191 | 189 | 159 | 154 | 195 | 194 |
| Percent of thermal expansion | Dimensional change (TMA) | % | 2.88 | 2.78 | 2.83 | 2.91 | 2.99 | 3.17 | 3.23 | 3.31 | 3.14 |
| T288 thermal resistance | T288 (TMA) | minute | >70 | >70 | >70 | >70 | >70 | 30 | 30 | 30 | 30 |
| Solder dipping | S/D | cycle | >20 | >20 | >20 | >20 | >20 | 18 | 17 | 18 | 19 |
| Dielectric constant | Dk@10 GHz @25° C. | no unit | 3.62 | 3.66 | 3.65 | 3.68 | 3.52 | 3.65 | 3.65 | 3.65 | 3.65 |
| Dissipation factor | Df@10 GHz @25° C. | no unit | 0.0055 | 0.0053 | 0.0057 | 0.0054 | 0.0055 | 0.0053 | 0.0056 | 0.0055 | 0.0058 |
| Dissipation factor post-moisture absorption | Df@10 GHz @25° C. after 5-hour PCT | no unit | 0.0057 | 0.0055 | 0.0059 | 0.0057 | 0.0057 | 0.0055 | 0.0060 | 0.0060 | 0.0065 |
| High temperature dissipation factor | Df@10 GHz & @120° C. | no unit | 0.0056 | 0.0054 | 0.0058 | 0.0057 | 0.0056 | 0.0055 | 0.0060 | 0.0061 | 0.0066 |
| Flame retardance | UL94 | no unit | V-0 | V-0 | V-0 | V-0 | V-0 | V-0 | V-0 | V-0 | V-0 |

What is claimed is:

1. A phosphorus-containing olefin polymer, comprising:
   (1) a first component; and
   (2) a second component,
   wherein the first component is cycloolefin, and the second component is a vinyl phosphorus-containing compound,
   wherein the vinyl phosphorus-containing compound is selected from the group consisting of a vinyl 9,10-dihydro-9-oxa-10-phosphaphenanthrene-10-oxide (DOPO)-containing compound, a vinyl diphenyl phosphine oxide (DPPO)-containing compound, a vinyl phosphazene compound, an acrylate DOPO-containing compound and a combination thereof, and
   wherein the cycloolefin is selected from the group consisting of dicyclopentadiene represented by formula (10), norbornene represented by formula (11) and a combination thereof,

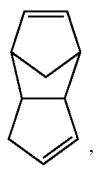

formula (10)

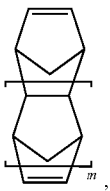

formula (11)

wherein m is a natural number of from 1 to 10.

2. The phosphorus-containing olefin polymer of claim 1, wherein the vinyl DOPO-containing compound comprises one of the following structural formulae:
formula (1)
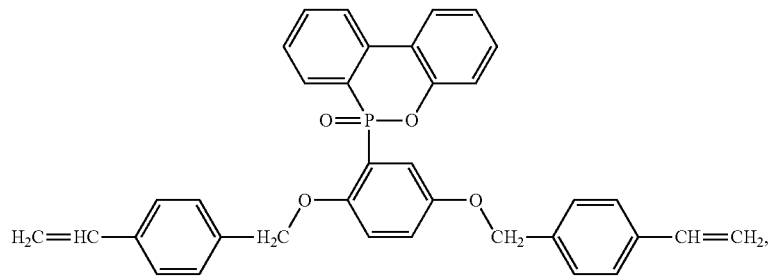
formula (2)
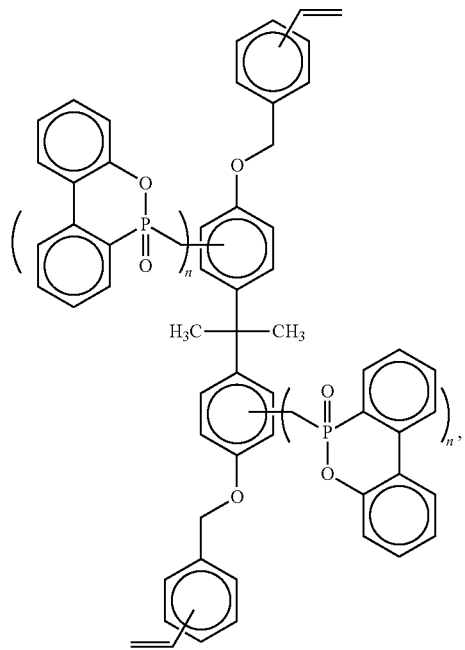

wherein n is an integer of from 1 to 4, and formula (3)

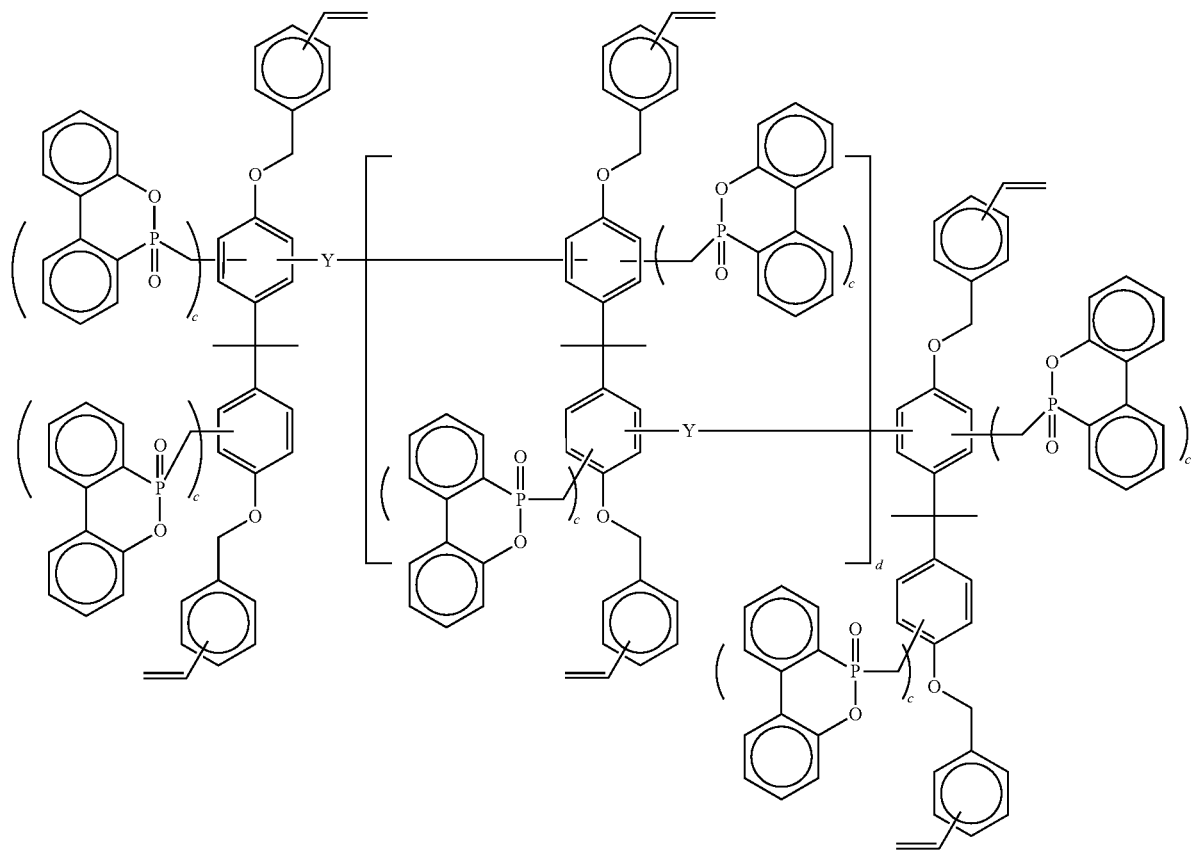

wherein Y is —CH$_2$— or —CH$_2$—O—CH$_2$—;
n is a natural number of from 1 to 4;
c is a natural number of from 1 to 4; and
d is 0 or a natural number of from 1 to 6;
wherein the vinyl DPPO-containing compound comprises the following structural formula:

formula (4)

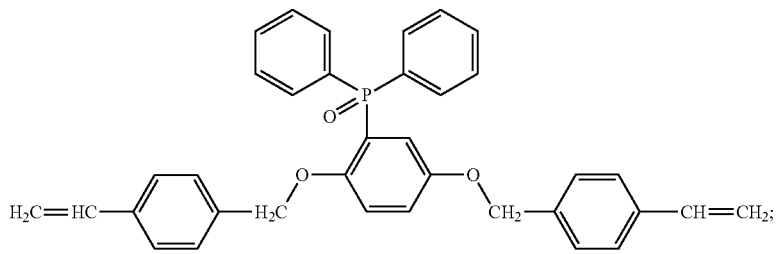

wherein the vinyl phosphazene compound comprises one of the following structural formulae:

formula (5)

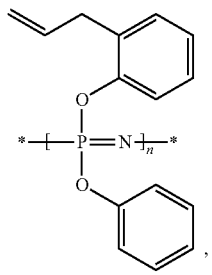

wherein n is an integer of from 1 to 6, and formula (6)

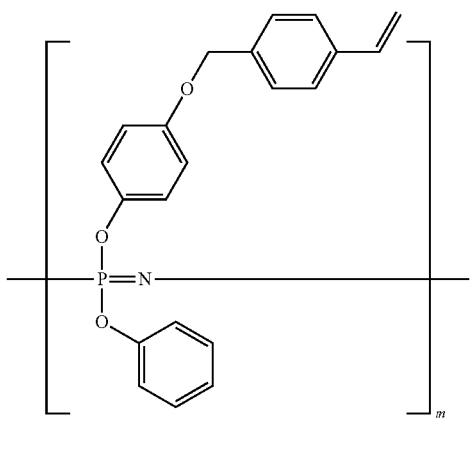

wherein m is an integer of from 1 to 6;

wherein the acrylate DOPO-containing compound comprises the following structural formula:

formula (9)

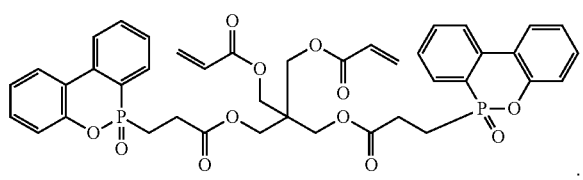

3. The phosphorus-containing olefin polymer of claim 1, wherein the phosphorus-containing olefin polymer further comprises a third component.

4. The phosphorus-containing olefin polymer of claim 3, wherein the third component is selected from the group consisting of divinylbenzene, bis(vinylbenzene)ether, bis(4-vinylphenyl)methane, bis(4-vinylphenyl)ethane, styrene, ethylene, butadiene and diethyl diallylmalonate.

5. A method for manufacturing a phosphorus-containing olefin polymer of claim 1, comprising:
polymerizing a first monomer and a second monomer in the presence of a catalyst to form a phosphorus-containing olefin polymer, wherein the first monomer is cycloolefin, and the second monomer is a vinyl phosphorus-containing compound,
wherein the vinyl phosphorus-containing compound is selected from the group consisting of a vinyl 9,10-dihydro-9-oxa-10-phosphaphenanthrene-10-oxide (DOPO)-containing compound, a vinyl diphenyl phosphine oxide (DPPO)-containing compound, a vinyl phosphazene compound, an acrylate DOPO-containing compound and a combination thereof, and
wherein the cycloolefin is selected from the group consisting of dicyclopentadiene represented by formula (10), norbornene represented by formula (11) and a combination thereof, formula (10)

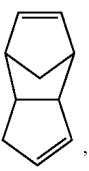

formula (11)

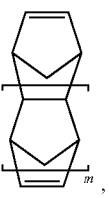

wherein m is a natural number of from 1 to 10.

6. The method for manufacturing a phosphorus-containing olefin polymer of claim 5, wherein the catalyst is selected from the group consisting of peroxide, a ruthenium catalyst and a metallocene catalyst.

7. The method for manufacturing a phosphorus-containing olefin polymer of claim 6, wherein the ruthenium catalyst is a Grubbs catalyst.

8. A composition, comprising the phosphorus-containing olefin polymer of claim 1.

9. An article manufactured from the composition of claim 8, wherein the article is a resin film, resin coated copper, a prepreg, a laminate or a printed circuit board.

\* \* \* \* \*